United States Patent
Kim et al.

(10) Patent No.: US 7,174,070 B2
(45) Date of Patent: Feb. 6, 2007

(54) ULTRAHIGH-FREQUENCY LIGHT SOURCE USING DUAL-WAVELENGTH LASER WITH 3-DB BEAM SPLITTER AND METHOD OF MANUFACTURING THE SAME

(75) Inventors: Dong Churl Kim, Daejeon (KR); Dae Su Yee, Daejeon (KR); Young Ahn Leem, Daejeon (KR); Kyung Hyun Park, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 147 days.

(21) Appl. No.: 10/883,955

(22) Filed: Jul. 1, 2004

(65) Prior Publication Data

US 2005/0129361 A1 Jun. 16, 2005

(30) Foreign Application Priority Data

Dec. 15, 2003 (KR) .............. 10-2003-0091340

(51) Int. Cl.
*G02B 6/26* (2006.01)
(52) U.S. Cl. .................................. 385/37; 385/39
(58) Field of Classification Search ............. 385/37, 385/39–48
See application file for complete search history.

(56) References Cited

U.S. PATENT DOCUMENTS 5,652,817 A * 7/1997 Brinkman et al. ............ 385/37
6,122,306 A 9/2000 Sartorius et al.
6,842,253 B2 * 1/2005 Lee et al. .................... 356/477

OTHER PUBLICATIONS

Y. Matsui, M.D., et al, "Beat frequency generation up to 3.4THz from simultaneous two-mode lasing operation of sampled-grating DBR laser", Electronics Letters, Mar. 18, 1999, vol. 35, No. 6, pp. 472-474.

S. Iio, et al., "Two-Longitudinal-Mode Laser Diodes" IEEE Electronics Technology Letters, vol. 7, No. 9, Sep. 1995, pp. 959-961.

S. D Roh, et al., "Single and Tunable Dual-Wavelength Operation of an InGaAs-GaAs Ridge Waveguide Distributed Bragg Reflector Laser", IEEE Transactions on Photonics Letters, vol. 12, No. 1, Jan. 2000, p. 16-18.

* cited by examiner

*Primary Examiner*—Kevin S. Wood
(74) *Attorney, Agent, or Firm*—Blakely Sokoloff Taylor & Zafman

(57) ABSTRACT

A light source has a structure in which a 3-dB beam splitter is integrated with a Febry-Perot laser diode having a cleaved plane. A first waveguide grating and a first refractive index modifier changing a Bragg wavelength of the first waveguide grating are provided at one branch of the 3-dB beam splitter. A second waveguide grating and a second refractive index modifier changing a Bragg wavelength of the second waveguide grating are provided at another branch of the 3-dB beam splitter.

14 Claims, 2 Drawing Sheets

ULTRAHIGH-FREQUENCY LIGHT SOURCE USING DUAL-WAVELENGTH LASER WITH 3-DB BEAM SPLITTER AND METHOD OF MANUFACTURING THE SAME

BACKGROUND OF THE INVENTION

This application claims the priority of Korean Patent Application No. 2003-91340, filed on Dec. 15, 2003, in the Korean Intellectual Property Office, the disclosure of which is incorporated herein in its entirety by reference.

1. Field of the Invention

The present invention relates to a semiconductor light source which generates ultrafast optical signals using beats of a dual-wavelength laser, and more particularly, to a tunable light source capable of continuously adjusting an interval between two wavelengths, and a method of manufacturing the same.

2. Description of the Related Art

Microwaves or millimeter waves through optical fiber have been researched since they can be applied to wireless access networks and phase array antennas. However, electrical approaches in the range of microwaves or millimeter waves are limited in a transmission distance and incur high expenses. Unlikely, light in a THz range transmits non-linear materials and thus can be used to produce solitons or process images. For this reason, methods of optically generating ultrafast signals having ultrahigh frequency in a range of GHz through THz have been researched and developed.

In a representative method, ultrafast optical signals can be generated by heterodyning two laser diodes whose lasing wavelengths are different by a desired frequency. Where a beat frequency of signals generated by the two laser diodes is converted into an electrical signals using a photodetector, a desired electrical beat signal having an ultrahigh frequency can be obtained. Such an optical mixing method is advantageous in generating microwaves or millimeter waves having a great power. When using optical fiber based communication systems, complexity of base station equipment is avoidable in a field of mobile communication.

S. llo proposed a structure enabling dual-mode pulsation by periodically shifting the phase of a grating when manufacturing a structure in which an active area and a Distributed Bragg Reflector (DBR) are integrated in a monolithic way [IEEE Photonics Technology Letters, vol. 7, pp. 959–961, 1995]. However, the proposed structure does not allow the mode interval between two lasing wavelengths to be changed, requires conditions for reliable lasing operation, complicates manufacturing processes since e-beam lithography is required to periodically shift the phase of a grating.

To overcome these problems, a device for generating ultrahigh-frequency optical signals using a sampled grating DBR employing a holographic method is disclosed in IEEE Electronic Letters [vol. 35, pp. 472–474, 1999]. However, the device requires very critical conditions to maintain the intensities of two lasing optical signals the same. Moreover, it is impossible to continuously change a wavelength interval (i.e., detuning) between two lasing signals,.

A device disclosed in IEEE Transaction on Photonics Letters [vol. 11, pp. 15–17, 1999] can continuously adjust an interval between lasing wavelengths, but intensity of light having two lasing wavelengths is not uniform. Moreover, e-beam lithography is required to manufacture gratings having different periods.

SUMMARY OF THE INVENTION

The present invention provides a tunable ultrafast light source capable of lasing two stable wavelengths and continuously adjusting a detuning between the two lasing wavelengths.

The present invention also provides a method of manufacturing a large yield of tunable ultrafast light sources without using e-beam lithography.

According to an aspect of the present invention, there is provided a light source having a structure in which a 3-dB beam splitter is integrated with a Febry-Perot laser diode having a cleaved plane. A first waveguide grating and a first refractive index modifier changing a Bragg wavelength of the first waveguide grating are provided at one branch of the 3-dB beam splitter. A second waveguide grating and a second refractive index modifier changing a Bragg wavelength of the second waveguide grating are provided at another branch of the 3-dB beam splitter.

The 3-dB beam splitter may be integrated with the Febry-Perot laser diode in a monolithic form or in a hybrid form. The 3-dB beam splitter may be integrated with the Febry-Perot laser diode using one method selected from the group consisting of butt-coupling, evanescent coupling, and coupling through selective area growth (SAG). Particularly, the 3-dB beam splitter may be a Y-branch or a 1×2 multi-mode interference (MMI) coupler. Ends of the respective first and second waveguide gratings may be coated with nonreflective films, respectively. Each of the first and second refractive index modifiers may be either of an electrode which applies reverse or forward voltage and a micro heater which applies heat.

The light source may further include a phase adjustor which changes a phase difference between waves propagating in branches of the 3-dB beam splitter. Here, the phase adjustor may be either of an electrode which applies reverse or forward voltage and a micro heater which applies heat.

According to another aspect of the present invention, there is provided a method of manufacturing a light source, the method including preparing a Febry-Perot laser diode having a cleaved plane; integrally forming a 3-dB beam splitter at a side of the Febry-Perot laser diode opposite to the cleaved plane; forming waveguide gratings at branches, respectively, of the 3-dB beam splitter using a holographic method; coating an end of each of the waveguide gratings with a nonreflective film; forming refractive index modifiers at the waveguide gratings, respectively, the refractive index modifiers changing Bragg wavelengths of the respective waveguide gratings; and forming a phase adjustor which changes a phase difference between waves propagating in the branches of the 3-dB beam splitter.

A light source according to the present invention has a semiconductor laser structure capable of stably generating two wavelengths. The light source can adjust a detuning of two wavelengths generated by an electrode applying a voltage or a current to two waveguide gratings or a micro heater applying heat to the two waveguide gratings so that the light source is tunable and generates ultrafast optical signals. In addition, the light source of the present invention has a simple structure so that holography instead of e-beam lithography may be used, thereby facilitating manufacturing. Since the operations of elements included in the light source can be independently controlled from an outside, a yield can be increased.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
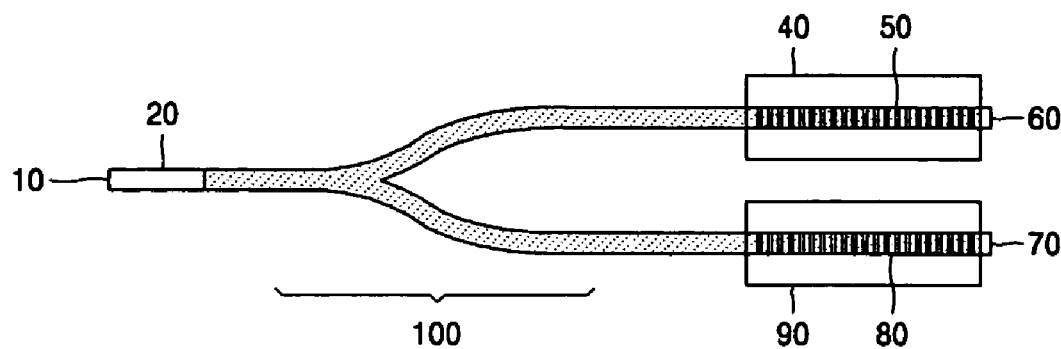
FIG. 1 is a schematic diagram of a light source according to a first embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements.

Referring to FIG. 1, a light source according to a first embodiment of the present invention has a structure in which a 3-dB Y-branch 100 is integrated into a Febry-Perot laser diode 20. The structure may be implemented by manufacturing the Febry-Perot laser diode 20 and the Y-branch 100 in either monolithic or hybrid form. More specifically, the Febry-Perot laser diode 20 and the Y-branch 100 may be integrated using butt-coupling, evanescent coupling, or coupling through selective area growth (SAG).

The Febry-Perot laser diode 20 has an lasing mode for different wavelengths. However, when external light having the same wavelength as one of the oscillation wavelengths of the Febry-Perot laser diode 20 is input to the Febry-Perot laser diode 20, the oscillation mode for wavelengths other than the wavelength of the external light is suppressed so that only the wavelength of the external light is output. The Febry-Perot laser diode 20 is a simplest resonator which is manufactured by cleaving a cleavage of a semiconductor material in parallel. A cleaved plane 10 acts like a reflecting mirror having a predetermined reflectivity due to a difference between a refractive index of the semiconductor material and a refractive index of the air and has a reflectivity of about 30% when the semiconductor material is a GaAs/AlGaAs material.

A first waveguide grating 50 and a second waveguide grating 80 are formed in the two branches, respectively, of the Y-branch 100. The first and second waveguide gratings 50 and 80 may be formed using a holographic method. The ends of the respective first and second waveguide gratings 50 and 80 are coated with nonreflective films 60 and 70, respectively. Where the nonreflective films 60 and 70 are formed, lasing wavelengths are stabilized so that high-frequency pulses with high quality are generated, a yield is increased, and a high power is obtained. In addition, external quantum efficiency is increased. The nonreflective films 60 and 70 may be formed of a silicon oxide layer, an aluminum oxide layer, a silicon layer, or a combination thereof in either single or dual layer structure. The nonreflective films 60 and 70 may be formed by depositing a layer having a high thickness uniformity using an e-beam evaporator or a sputter.

First and second refractive index modifiers 40 and 90 which respectively change Bragg wavelengths of the respective first and second waveguide gratings 50 and 80 are provided at the first and second waveguide gratings 50 and 80, respectively. The first and second refractive index modifiers 40 and 90 are implemented by electrodes, which apply a reverse voltage to the first and second waveguide gratings 50 and 80, respectively, thereby giving a voltage difference, or apply a forward voltage to the first and second waveguide gratings 50 and 80, respectively, thereby allowing current to flow, or micro heaters which apply heat to the first and second waveguide gratings 50 and 80. The refractive indexes of the respective first and second waveguide gratings 50 and 80 can be changed by the first and second refractive index modifiers 40 and 90, respectively, so that a Bragg wavelength interval (i.e., detuning) can be continuously changed.

In the first embodiment of the present invention shown in FIG. 1, the first and second refractive index modifiers 40 and 90 modify the refractive indexes of the first and second waveguide gratings 50 and 80, respectively, by applying voltage, current, or heat to the first and second waveguide gratings 50 and 80. Where the Bragg wavelengths of the respective first and second waveguide gratings 50 and 80 are different from each other due to the operation of the first and second refractive index modifiers 40 and 90, light having the two wavelengths are fed back to the Febry-Perot laser diode 20. Since the Febry-Perot laser diode 20 has the cleaved plane 10 at one end, about 30% of the light is reflected from the cleaved plane 10. Meanwhile, two Bragg wavelengths are reflected from the first and second waveguide gratings 50 and 80, respectively. Where current higher than a threshold is applied to the Febry-Perot laser diode 20, the two wavelengths have coherency since they share a single gain material so that a dual-wavelength laser having coherent two lasing wavelengths can be implemented. Consequently, an optical signal generated by a beat of two coherent wavelengths is output from the cleaved plane 10 of the Febry-Perot laser diode 20.

As described above, the first and second refractive index modifiers 40 and 90 make modification to refractive indexes by applying voltage, current, or heat to the first and second waveguide gratings 50 and 80, respectively. Since the first and second refractive index modifiers 40 and 90 can be easily operated independently from the outside thereof, wavelengths respectively generated at the first and second waveguide gratings 50 and 80 can be easily adjusted, a detuning between the two wavelengths can be continuously adjusted, and an ultrafast optical signal can be obtained due to beats of the two wavelengths.

The first embodiment of the present invention provides a simple laser structure which enables two stable wavelengths to be oscillated and does not require e-beam lithography so that light sources capable of generating ultrafast optical signals using only an optical element can be easily manufactured in high yield.

Figure 2:
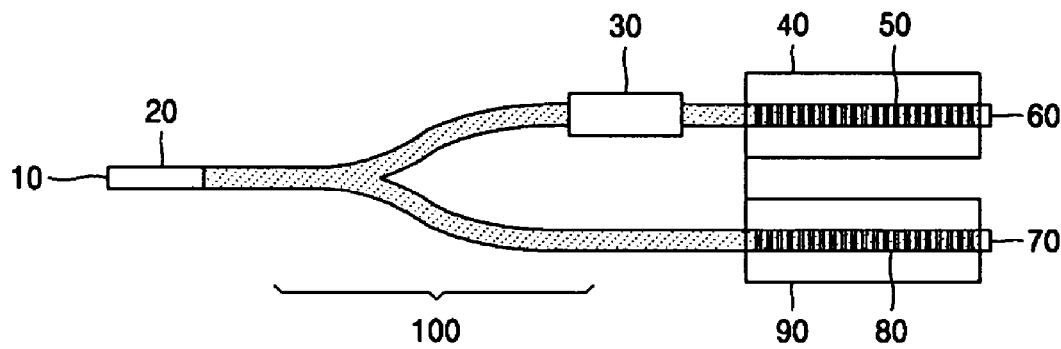
FIG. 2 is a schematic diagram of a light source according to a second embodiment of the present invention.

FIG. 2 is a schematic diagram of a light source according to a second embodiment of the present invention. The light source according to the second embodiment is the same as that according to the first embodiment, with the exception that the light source according to the second embodiment further includes a phase adjustor 30 which changes a phase difference between waves propagating in two branches. The phase adjustor 30 may be an electrode which applies a reverse or forward voltage or a micro heater which applies heat. The phase adjustor 30 may be provided in each branch.

Figure 3:
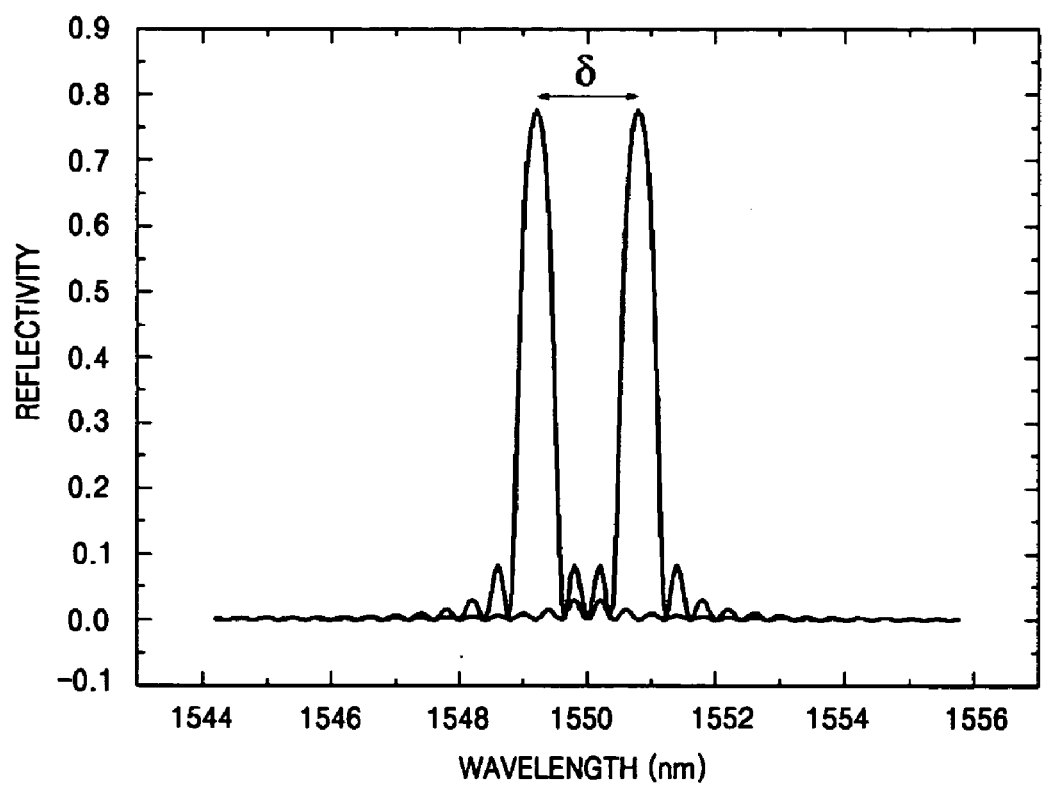
FIG. 3 is a graph of a reflection spectrum of a grating detuned in the light source shown in FIG. 2.

FIG. 3 is a graph of a reflection spectrum of a grating detuned in the light source shown in FIG. 2. A beat wave corresponding to a detuning δ is generated at the cleaved plane 10 of the Febry-Perot laser diode 20. Here, in order to stabilize wavelengths, a Febry-Perot mode spacing occurring due to a length of an effective light source should be wider than ½ of the full width at half maximum of the reflection spectrum of the first and second refractive index modifiers 40 and 90.

Figure 4:
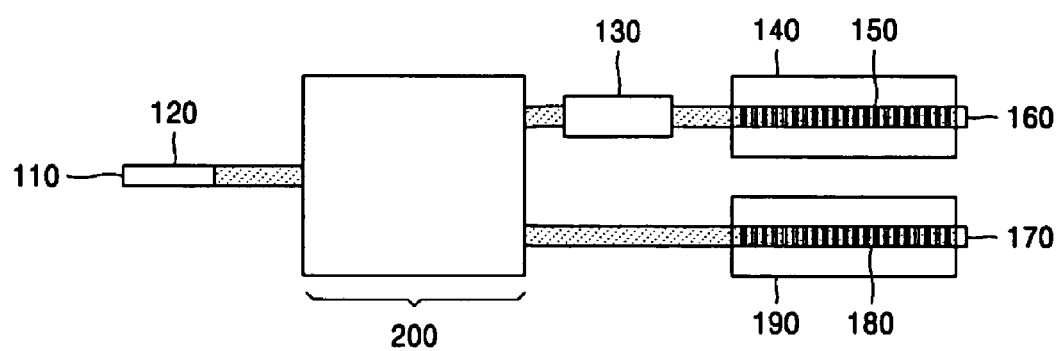
FIG. 4 is a schematic diagram of a light source according to a third embodiment of the present invention.

FIG. 4 is a schematic diagram of a light source according to a third embodiment of the present invention, which is provided to the same effects as described with reference to FIG. 1. In the third embodiment, a 1×2 multi-mode interference (MMI) coupler 200 instead of the Y-branch 100 is used as a 3-dB beam splitter. Besides a Y-branch and an MMI coupler, any structure corresponding to either of them can realize effects of the present invention.

Referring to FIG. 4, a Febry-Perot laser diode 120 and the 1×2 MMI coupler 200 may be integrated in either monolithic or hybrid form.

A first waveguide grating 150 and a second waveguide grating 180 are formed in the two branches, respectively, of the 1×2 MMI coupler 200. The ends of the respective first and second waveguide gratings 150 and 180 are coated with nonreflective films 160 and 170, respectively. First and second refractive index modifiers 140 and 190 which respectively change Bragg wavelengths of the respective first and second waveguide gratings 150 and 180 are provided at the first and second waveguide gratings 150 and 180, respectively. The first and second refractive index modifiers 140 and 190 are implemented by electrodes, which apply a reverse voltage to the first and second waveguide gratings 150 and 180, respectively, thereby giving a voltage difference, or apply a forward voltage to the first and second waveguide gratings 150 and 180, respectively, thereby allowing current to flow, or micro heaters which apply heat to the first and second waveguide gratings 150 and 180. The refractive indexes of the respective first and second waveguide gratings 150 and 180 can be changed by the first and second refractive index modifiers 140 and 190, respectively, so that a Bragg wavelength interval (i.e., detuning) can be continuously changed.

As described above, light sources shown in FIGS. 1, 2, and 4 can be manufactured using either monolithic or hybrid method. For example, when using butt-coupling as a monolithic method, the Febry-Perot laser diode 20 or 120 is grown on a substrate and then partially etched, and a 3-dB beam splitter (i.e., the Y-branch 100 or the 1×2 MMI coupler 200) is selectively grown in the etched portion. According to the butt-coupling, the Febry-Perot laser diode 20 or 120 and the 3-dB beam splitter 100 or 200 are optimally designed, thereby realizing reliable monolithic integration. Alternatively, when using evanescent coupling, a waveguide having two core layers is formed, and the waveguide is removed leaving a single core layer having a predetermined length to provoke evanescent field coupling. SAG may be used to selectively grow crystals on a flat layer using a dielectric layer as a mask.

In a hybrid method, the Febry-Perot laser diode 20 or 120 and the 3-dB beam splitter 100 or 200 are separately prepared and integrated onto a single silica planar lightwave circuit (PLC) substrate. For example, after the 3-dB beam splitter 100 or 200 is formed on a substrate, the Febry-Perot laser diode 20 or 120 may be formed on the substrate.

The waveguide gratings 50, 80, 150 and 180 may be formed using a holographic method. For example, a grating layer is grown to a thickness of about 100–500 Å. Next, to form a grating using a holographic method, a silicon nitride ($SiN_x$) layer is formed on the grating layer to a thickness of about 500 Å. Next, the silicon nitride layer is coated with photoresist. Next, a holographic method is used to form a sine-shaped photoresist pattern partially exposing the silicon nitride layer. To perform this holographic method, a holographic system including an argon ion laser is used. Here, a period is determined by an angle between two beams of the interfered argon ion laser. After forming the photoresist pattern, the silicon nitride layer is dry etched using a magnetically enhanced reactive ion etcher (MERIE) and using the photoresist pattern as a mask, thereby forming a silicon nitride layer pattern exposing the grating layer. Thereafter, the photoresist pattern is removed. Next, an etch using a nonselective etchant or a dry etch is performed using the silicon nitride layer pattern as a mask, thereby forming a grating.

The present invention relates to a ultrahigh-frequency light source that has been widely researched and developed and can be applied to fields of wireless access networks, producing solitons used for phase arrange antennas and ultrafast optical communication, and image processing.

A light source according to the present invention has a semiconductor laser structure capable of stably generating two wavelengths. The light source can adjust a detuning of two wavelengths generated by an electrode applying a voltage or a current to two waveguide gratings or a micro heater applying heat to the two waveguide gratings so that the light source is tunable.

In addition, a light source of the present invention has a simple structure so that holography instead of e-beam lithography may be used. As a result, the light source of the present invention can be easily manufactured. Since the operations of elements included in the light source can be independently controlled from an outside using voltage, current, or heat, the effect of the present invention can be easily accomplished and a yield can be increased as compared to conventional technology.

Moreover, since the present invention is closely connected with conventional techniques such as monolithic integration and hybrid integration, conventional techniques can be directly used or complemented. Also, the present invention can bring a direction of new development.

While this invention has been particularly shown and described with reference to preferred embodiments thereof, it will be understood by those skilled in the art that various changes in form and details may be made therein without departing from the spirit and scope of the invention as defined by the appended claims. For example, in the embodiments of the present invention, monolithic integration has been described. However, hybrid integration can also realize the same effects as those described in the embodiment of the present invention.

What is claimed is:

1. A light source comprising:
   a Febry-Perot laser diode having a cleaved plane;
   a 3-dB beam splitter which is integrally provided at a side of the Febry-Perot laser diode opposite to the cleaved plane;
   a first waveguide grating which is provided at one branch of the 3-dB beam splitter;

a first refractive index modifier which changes a Bragg wavelength of the first waveguide grating;

a second waveguide grating which is provided at another branch of the 3-dB beam splitter; and a second refractive index modifier which changes a Bragg wavelength of the second waveguide grating, wherein each of the first refractive index modifier and the second refractive index modifier is a micro heater.

2. The light source of claim 1, wherein the 3-dB beam splitter is integrated with the Febry-Perot laser diode in a monolithic form.

3. The light source of claim 1, wherein the 3-dB beam splitter is integrated with the Febry-Perot laser diode in a hybrid form.

4. The light source of claim 1, wherein the 3-dB beam splitter is integrated with the Febry-Perot laser diode using one method selected from the group consisting of butt-coupling, evanescent coupling, and coupling through selective area growth (SAG).

5. The light source of claim 1, wherein the 3-dB beam splitter is a Y-branch.

6. The light source of claim 1, wherein the 3-dB beam splitter is a 1×2 multi-mode interference (MMI) coupler.

7. The light source of claim 1, wherein ends of the respective first and second waveguide gratings are coated with nonreflective films, respectively.

8. The light source of claim 1, further comprising a phase adjustor which changes a phase difference between waves propagating in branches of the 3-dB beam splitter.

9. The light source of claim 8, wherein the phase adjustor is either of an electrode which applies voltage and a micro heater which applies heat.

10. The light source of claim 1, wherein each of the first and second refractive index modifiers is either of an electrode which applies voltage and a micro heater which applies heat.

11. A method of manufacturing a light source, comprising:
preparing a Febry-Perot laser diode having a cleaved plane;

integrally forming a 3-dB beam splitter at a side of the Febry-Perot laser diode opposite to the cleaved plane;

forming waveguide gratings at branches, respectively, of the 3-dB beam splitter using a holographic method;

coating an end of each of the waveguide gratings with a nonreflective film;

forming refractive index modifiers at the waveguide gratings, respectively, the refractive index modifiers changing Bragg wavelengths of the respective waveguide gratings, wherein each of the refractive index modifiers is a micro heater; and forming a phase adjustor which changes a phase difference between waves propagating in the branches of the 3-dB beam splitter.

12. The method of claim 11, wherein the 3-dB beam splitter is integrated with the Febry-Perot laser diode in a monolithic form.

13. The method of claim 11, wherein the 3-dB beam splitter is integrated with the Febry-Perot laser diode in a hybrid form.

14. The method of claim 11, wherein the phase adjustor is either of an electrode which applies voltage and a micro heater which applies heat.

* * * * *